United States Patent [19]

Matsumoto

[11] Patent Number: 4,895,060

[45] Date of Patent: Jan. 23, 1990

[54] ELECTRONIC DEVICE OF A TYPE IN WHICH MUSICAL TONES ARE PRODUCED IN ACCORDANCE WITH PITCHES EXTRACTED FROM INPUT WAVEFORM SIGNALS

[75] Inventor: Naoaki Matsumoto, Tachikawa, Japan

[73] Assignee: Casio Computer Co., Ltd., Tokyo, Japan

[21] Appl. No.: 256,400

[22] Filed: Oct. 11, 1988

[30] Foreign Application Priority Data

Oct. 14, 1987 [JP] Japan ............ 62-259293
Aug. 31, 1988 [JP] Japan ............ 63-214926

[51] Int. Cl.$^4$ ............ G01R 23/02; G10H 1/44; G10H 3/18

[52] U.S. Cl. ............ 84/616; 84/454; 84/DIG. 18; 324/79 D

[58] Field of Search ............ 84/1.01, 1.04–1.16, 84/454, DIG. 18; 324/78 R, 78 D, 79 R, 79 D

[56] References Cited

U.S. PATENT DOCUMENTS

| | | | |
|---|---|---|---|
| 4,117,757 | 10/1978 | Akamatu . | |
| 4,151,775 | 5/1979 | Merriman | 84/1.01 |
| 4,217,808 | 8/1980 | Slepian et al. | 84/454 |
| 4,351,216 | 9/1982 | Hamm | 84/454 X |
| 4,377,961 | 3/1983 | Bode | 84/1.01 |
| 4,429,609 | 2/1984 | Warrender | 84/454 |
| 4,606,255 | 9/1986 | Hayashi et al. . | |
| 4,627,323 | 12/1986 | Gold | 84/1.01 |
| 4,633,748 | 1/1987 | Takashima et al. . | |
| 4,665,790 | 5/1987 | Rothschild | 84/454 |
| 4,688,464 | 8/1987 | Gibson et al. . | |

FOREIGN PATENT DOCUMENTS

| | | |
|---|---|---|
| 55-55398 | 4/1980 | Japan . |
| 55-87196 | 7/1980 | Japan .. |
| 55-159495 | 12/1980 | Japan . |
| 57-37074 | 8/1982 | Japan . |
| 57-58672 | 12/1982 | Japan . |

*Primary Examiner*—Stanley J. Witkowski
*Attorney, Agent, or Firm*—Frishauf, Holtz, Goodman & Woodward

[57] ABSTRACT

A musical tone generating device generates musical tones of a frequency in accordance with pitches which are extracted from input waveform signals by a pitch extracting means. When a pitch extracted by the pitch extracting means varies within a range of a predetermined musical interval difference, an average of the currently extracted pitch and the previously extracted pitch is calculated and the frequency of the musical tone is defined on the basis of the calculated average which serves as a current pitch. On the other hand, when the currently extracted pitch exceeds the above-mentioned range, the frequency of the musical tone is defined on the basis of the currently extracted pitch. In this manner, an undesirable influence to the sound frequency caused by any unnecessary variations or fluctuations in the pitch is decreased or eliminated, thereby enabling producing of a steady sound frequency. In addition, when the pitch is intentionally altered, the frequency of the musical tone is instantly changed in response to the pitch alteration.

15 Claims, 10 Drawing Sheets

ELECTRONIC DEVICE OF A TYPE IN WHICH MUSICAL TONES ARE PRODUCED IN ACCORDANCE WITH PITCHES EXTRACTED FROM INPUT WAVEFORM SIGNALS

BACKGROUND OF THE INVENTION

The present invention relates to an electronic device of a type in which musical tones are generated in accordance with pitches extracted from input waveform signals, and more particularly to an electronic string musical instrument such as an electronic guitar and a guitar sythesizer.

Recently, there have been developed various electronic instruments in which a pitch (a fundamental frequency) is extracted from a human voice or a waveform signal generated in response to a performance operation of a natural or conventional musical instrument, and under control of the extracted pitch, a sound source unit of electronic circuits is driven to artificially generate sounds such as musical tones.

This type of the technique is disclosed in the following documents: U.S. Pat. No. 4,117,757, issued Oct. 3, 1978, Akamatsu; U.S. Pat. No. 4,606,255, issued Aug. 19, 1986, Hayashi et al.; U.S. Pat. No. 4,633,748, issued Jan. 6, 1987, Takashima et al.; U.S. Pat. No. 4,688,464, issued Aug. 25, 1987, Gibson etal.; KOKOKU No. 57-37074, examined publication Aug. 7, 1982, Applicant ROLAND KABUSHIKI KAISHA; KOKOKU No. 57-58672, examined publication Dec. 10, 1982, Applicant ROLAND KABUSHIKI KAISHA; KOKAI No. 55-55398 published Apr. 23, 1980, Applicant TOSHIBA KABUSHIKI KAISHA; KOKAI No. 55-87196, published July 1, 1980, Applicant NIPPON GAKKI SEIZO KABUSHIKI KAISHA; KOKAI No. 55-159495, published Dec. 11, 1980, Applicant NIPPON GAKKI SEIZO KABUSHIKI KAISHA; KOKAI (Utility Model) No. 55-152597, published Nov. 4, 1980, Applicant NIPPON GAKKI SEIZO KABUSHIKI KAISHA; KOKAI (Utility Model) No. 55-162132, published Nov. 20, 1980, Applicant KEIOU KIGGEN KOUGYO KABUSHIKI KAISHA; KOKOKU No. 61-51793, examined publication Nov. 10, 1986, Applicant NIPPON GAKKI SEIZO KABUSHIKI KAISHA; KOKOKU (Utility Model) No. 62-20871, examined publication May 27, 1987, Applicant FUJI ROLAND KABUSHIKI KAISHA.

Further, Uchiyama et al. filed on Oct. 22, 1987 a U.S. Pat. Application Ser. No. 112,780 which discloses a system relating to the present electronic device.

In the prior arts disclosed in the above identified documents, a frequency of a musical tone generated from a sound source is varied, in general, in accordance with a pitch of human voice or a vibration signal, which pitch varies with respect to time.

For instance, in the guitar sythesizer, the string tension if varied by a manipulation of the tremolo arm, whereby the frequency of the string vibration changes. Or a choking manipulation increases the frequency of the string vibration. It is required that the frequency of the musical tone to be generated from the sound source varies in accordance with such pitch variations. Various improvements have been made in conventional systems to fulfill such requirements.

In the conventional systems, emphasis has been placed only on the effect that the frequency of the musical tone faithfully follows the variations in the pitch. Accordingly, for example, there has been caused such a problem that the musical tone to be generated follows fine variations in the string vibration with an excess sensitiveness so that it produces frequency variations which are harsh to the ear.

SUMMARY OF THE INVENTION

The present invention has been made in the light of the above, and its objects is to provide an electronic device of the type in which a pitch is extracted from an input waveform signal to generate a sound of a frequency which corresponds to the extracted pitch, and the frequency of the output sound is varied in accordance with variations in the pitch, but in which the output sound has no unnecessary variations of the frequency.

In particular, it is another object of the present invention to provide a frequency control device used in an electronic string musical instrument in which an influence caused by fine variations in the string vibration is reduced to minimize frequency fluctuations in a musical tone to be generated, whereby the player of the musical instrument does not feel so much the frequency fluctuations.

According to one aspect of the present invention, there is provided a frequency control device of an electronic string musical instrument in which a vibration waveform is generated on the basis of string vibrations, a fundamental wave period is extracted from the vibration waveform and a sound having a frequency corresponding to the extracted period is generated, comprising: period extracting means for extracting the fundamental wave period of said vibration waveform; variation range detecting means for detecting a variation range of the fundamental wave period extracted by said period extracting means; and smoothing means for smoothing both a currently extracted fundamental wave period and a previously extracted fundamental wave period in order to obtain another fundamental wave period, when said variation range detecting means detects that the variation range of the fundamental wave period remains within a predetermined musical interval difference, said smoothing means including means for defining the frequency of an output sound in accordance with said another fundamental wave period.

According to the present invention, as long as a variation range of period data of string vibrations which are newly caused remains within a predetermined range, for example, a range of ±100 cent, period data newly obtained and several period data previously obtained are smoothed. For example, an average period of the period data previously obtained and the period data currently or lastly obtained is calculated and under control of the above calculated average period, which serves as the period data, a musical tone generating means generates a musical tone, whereby fine variations in the string vibration have little unfavorable influence on a frequency of a musical tone to be generated. On the other hand, when the period extracted from the string vibration exceeds, for example, the range of ±100 cent, a sound pitch is determined under control of the currently or lastly extracted pitch, meaning that the player of the musical instrument intentionally changes the sound pitch.

The present invention can be employed not only in electronic string musical instruments but also in apparatus for generating musical tones or sounds of a sound pitch which corresponds to a pitch extracted from a human voice or musical instrument tones.

As one of such modes, there is provided a frequency control device of an electronic apparatus, in which a pitch is extracted from an input vibration waveform and a sound generation with a frequency corresponding to the extracted pitch is instructed, comprising: variation range detecting means for detecting a variation range of the pitch of said input vibration waveform; control means for obtaining another current pitch by subjecting a currently or lastly extracted pitch of said input vibration waveform and a previously obtained pitch to a smoothing processing and for defining the frequency of a sound to be output in accordance with the thus obtained another current pitch, when said variation range detecting means detects that the variation range of the pitch of the input vibration waveform remains within a range of a predetermined musical interval difference, and said control means further including means for defining the frequency of the sound to be output in accordance with the currently extracted pitch of the input vibration waveform which serves as the current pitch, when the variation range detecting means detects that that vibration range of the pitch of the input vibration waveform exceeds the range of the predetermined musical interval difference.

BRIEF DESCRIPTION OF THE DRAWINGS

Other objects and features of the present invention will be understood to those skilled in the art when carefully reading the detailed description of the preferred embodiments in connection with the accompanying drawings; in which.

DETAILED DESCRIPTION OF THE PREFERRED EMBODIMENT

Figure 1:
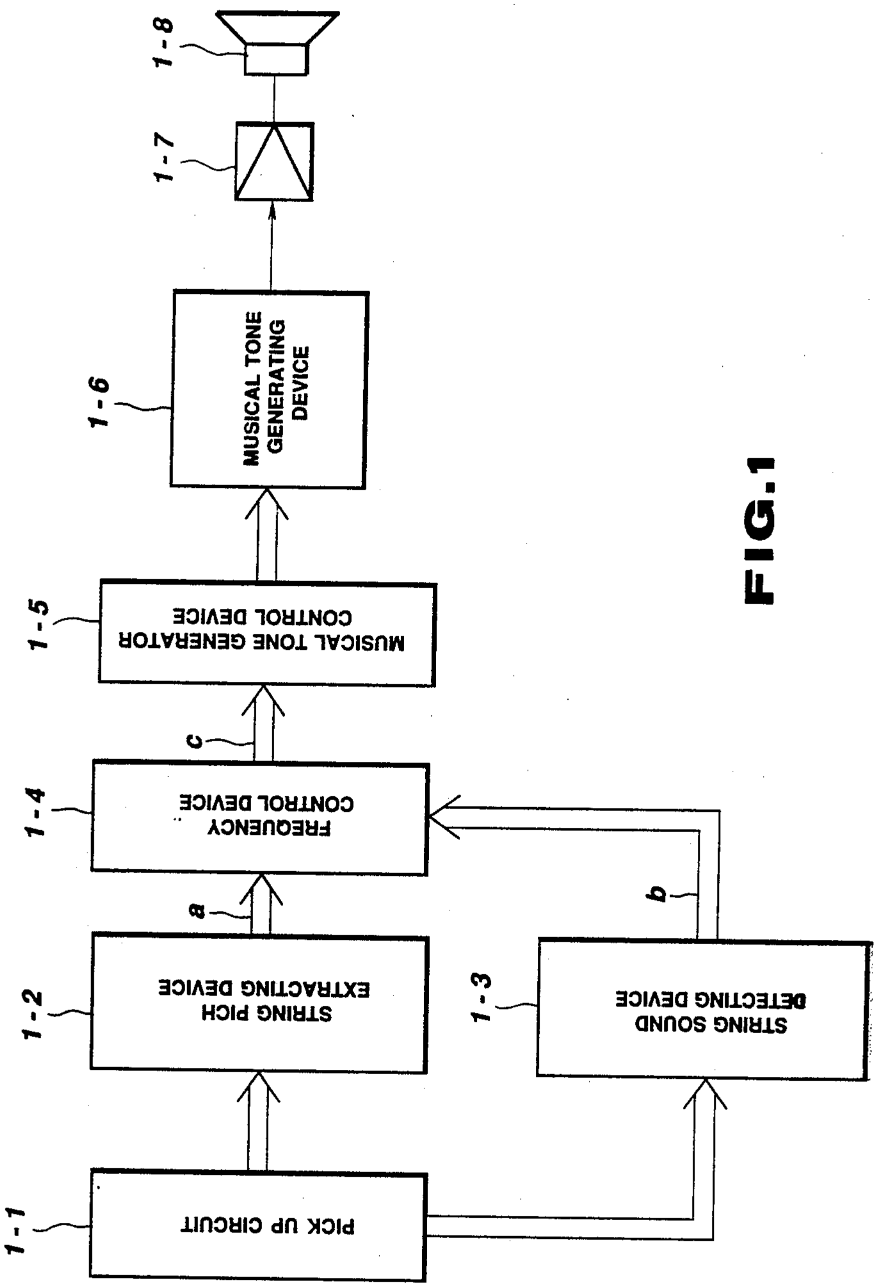
FIG. 1 shows an overall arrangement of an embodiment of the present invention applied in an electronic string musical instrument.

A preferred embodiment of the present invention will be described hereinafter with reference to the attached drawings. FIG. 1 shows an overall arrangement of an embodiment of the present invention applied in an electronic string musical instrument of a guitar type. The string vibrations are converted into electrical signals by a pick up circuit 1-1 to be transferred to a string pitch extracting device 1-2. The fundamental frequency (the string pitch) is extracted from the string vibration by the string pitch extracting device 1-2 and is transferred as period data to a frequency control device 1-4 through a frequency data bus a. The electrical signal converted by the pick up circuit 1-1 is transferred to a string sound detecting device 1-3. The definite arrangement of the string pitch extracting device 1-2 and the string sound detecting device 1-3 is not described in detail herein but those devices can be realized by utilizing the various prior arts mentioned above. In particular, the invention of U.S. Pat. Application Ser. No. 112,780 made by Uchiyama et al. can be suitably employed for composing those devices. The string sound detecting device 1-3 detects the start and/or ending of the string vibration to obtain trigger data and/or off data. The trigger data and off data are output to the frequency control device 1-4 through a sound ON/OFF bus b. The frequency control device 1-4 obtains note-on data, cent data and note-off data from the received period data, trigger data and off data, respectively and then the note-on data, cent data and note-off data are output to a musical tone generator control device 1-5 through an I/O bus c. The musical tone generator control device 1-5 assigns musical tones to sound source modules which are contained in the musical tone generating device 1-6 and serve as a plurality of musical tone generating channels, thereby executing a sound generation control such as a musical tone generation, elimination and a frequency control. The musical tone output from the musical tone generating device 1-6 is transferred to an amplifier 1-7 and a speaker 1-8 to produce a sound.

Figure 2:
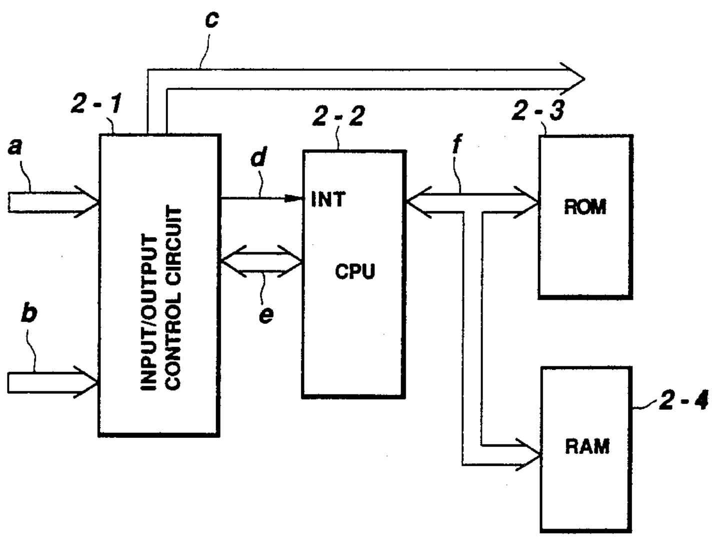
FIG. 2 shows details of a frequency control device shown in FIG. 1.

FIG. 2 shows an arrangement illustrating details of the frequency control device 1-4 of FIG. 1. In FIG. 2, a CPU 2-2 executes a predetermined control operation in accordance with data or a signal which is supplied by an input/output control circuit 2-1. A ROM 2-3 stores programs for various processes to be executed by CPU 2-2. A RAM 2-4 serves to store various data utilized in CPU 2-2. CPU 2-2 is connected to ROM 2-3 and RAM 2-4 through a memory bus f.

The input/output control circuit 2-1 is supplied with data indicating pitches from the string pitch extracting device 1-2 of FIG. 1 through the frequency or period data bus a and also is supplied with trigger data and off data from the string sound detecting device 1-3 through the sound ON/OFF bus b.

Upon receipt of trigger data, the input/output control circuit 2-1 provides CPU 2-2 with an interrupt signal through an interrupt line d to instruct to execute processes to be described later. Delivery of data between CPU 2-2 and the input/output control circuit 2-1 is performed through a bus e.

As described above, the input/output control circuit 2-1 supplies the musical tone generator control device 1-5 with various data through the I/O bus c.

Now, the operation of CPU 2-2 will be described hereinafter. The following description is made on the assumption that an arbitrary string of an electronic string musical instrument starts its vibration at a normal fundamental frequency and ceases its vibration.

In FIG. 1, when the start of the string vibration is detected by the string sound detecting device 1-3, trigger data is transferred to the input/output control circuit 2-1 through the sound ON/OFF bus b. The trigger data includes the number of the string operated and the level data. The level data is the data which corresponds to the maximum amplitude of the string vibration at the time the string starts its vibration. As long as the string vibration is on, the string pitch extracting device 1-2 of FIG. 1 continues to send period data to the input/output control circuit 2-1 of FIG. 2 through the frequency data bus a. The period data includes the fundamental period of the operated string and the numerical value corresponding to the string number. When the input/output control circuit 2-1 receives period data after receipt of trigger data, the control circuit 2-1 interrupts CPU 2-2 through the interrupt line d.

Figure 3:
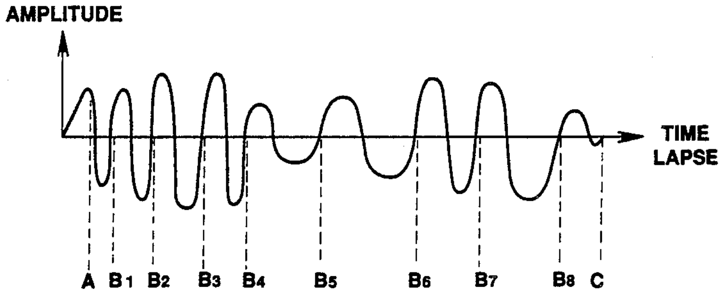
FIG. 3 illustrates a model which shows a state of a string vibration.

FIG. 3 shows a state of the string vibration. The abscissa axis in FIG. 3 represents the time lapse and the ordinate axis represents the amplitude of the string vibration. At point "A" on the time axis in FIG. 3, the string sound detecting device 1-3 detects that the string vibration starts and outputs trigger data to the input/output control circuit 2-1 of FIG. 2 through the sound ON/OFF bus b. Then, the string pitch extracting device 1-2 determines the fundamental frequency (pitch) of the string vibration at point "$B_1$" on the time axis and outputs the period data to the input/output control circuit 2-1 through the frequency data bus a. In this case, when the input/output control circuit 2-1 receives period data after receiving trigger data with respect to the same string, an interrupt instruction is conveyed to CPU 2-2 through the interrupt line d to inform that the string starts its vibration.

Upon receipt of the interrupt instruction, CPU 2-2 reads out period data from the input/output control circuit 2-1 and obtains note-on data and cent data by executing an arithmetic operation on the period data. Then CPU 2-2 transfers those data to the musical tone generator control device 1-5 through the I/O bus c. As an example, if the frequency of $A_4$ is 440 Hz and the note-on data is 40, the note-on data will be 41 (A'hd 4 #) and the cent data will be 10 cent. Then, the period data is 2,133 m sec (468.9 Hz).

In FIG. 3, at each of points "$B_2$" through "B'hd 8" on the time axis, the string pitch extracting device 1-2 transfers period data to the input/output control circuit 2-1 in the similar manner but in the case of points "$B_2$" through "$B_8$", the input/output control circuit 2-1 does not output the interrupt instruction to CPU 2-2. That is, CPU 2-2 reads period data at predetermined intervals to calculate, for example, an arithmetic mean of period data. When the variation range of period data read by the CPU 2-2 corresponds to a musical interval difference within a predetermined range, i.e. the period data read in last has a value within the range of $\pm 100$ cent (a semi-tone) with respect to the arithmetic means of period data which has been calculated previously, the CPU 2-2 calculates cent data by using the arithmetic mean of period data calculated last and the note-on data obtained at the start of a sound generation and further CPU 2-2 outputs the calculated cent data to the musical tone generator control device 1-5 through the I/O bus c. If the variation range of period data read by CPU 2-2 exceeds the $\pm 100$ cent range mentioned above, CPU 2-2 determines that the player of the instrument intentionally changes the frequency of the tone. In this case, CPU 2-2 calculates cent data from the received period data and the note-on data obtained at the start of the sound generation and outputs the calculated cent data to the musical tone generator control device 1-5, thereby improving the faithfullness to the frequency variations.

In FIG. 3, period data at points "$B_1$" through "$B_8$" on the time axis are represented by "$t_1$" through "$t_8$", respectively. If the difference between $(t_3+t_4)/2$ and $t_5$ is larger than 100 cent, and also the difference between $(t_5+t_6)/2$ and $t_7$ is larger than 100 cent, the operations are executed on period data in order of $t_1$, $(t_1+t_2)/2$, $(t_2+t_3)/2$, $(t_3+t_4)/2$, $t_5$, $(t_5+t_6)/2$, $t_7$ and $t_8$. When the point "c" is reached, the string sound detecting device 1-3 outputs off-data to the input/output control circuit 2-1 and then the input/output control circuit 2-1 generates and sends an interrupt instruction to CPU 2-2, thereby informing that the string vibration ceases. CPU 2-2 sends note-off data to the musical tone generator control device 1-5, too. Note that FIG. 3 illustrates a model of a waveform change for better understanding of the operation of the present embodiment, but, in practice, the waveform does not change so much as illustrated in FIG. 3.

Referring to FIGS. 4 through 11, the operation of CPU 2-2 of FIG. 2 will be described in further detail hereinafter.

Figure 4:
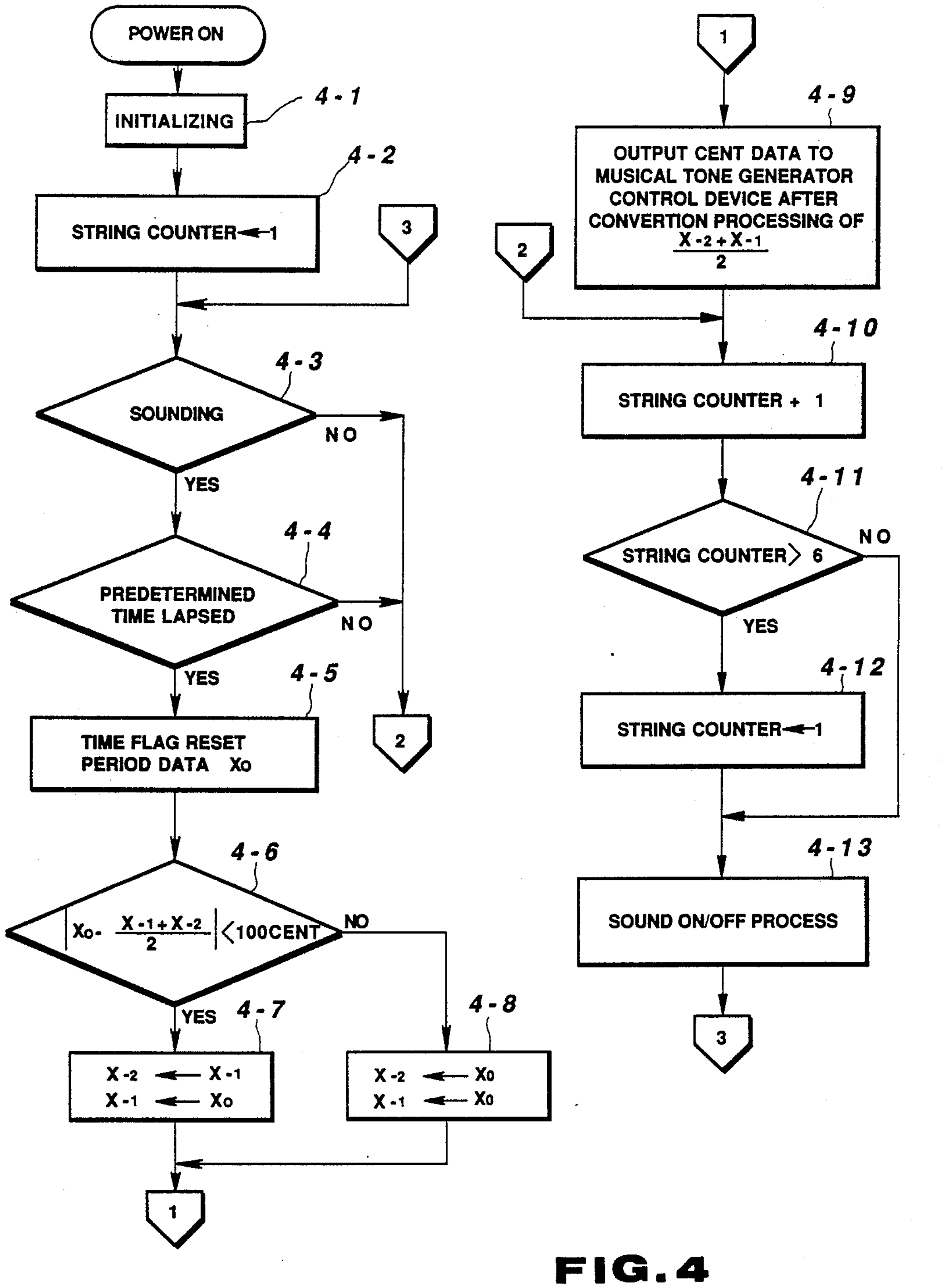
FIG. 4 shows a flowchart of a main routine useful in explaining an operation of a CPU employed in the frequency control device of FIG. 2.

FIG. 4 shows the flowchart of the main routine operated by CPU 2-2. After the power is turned on in the electronic string musical instrument, an initializing process is executed in STEP 4-1 to reset all the flags. Level "1" is set to a string counter which is formed in RAM 2-4 (other registers mentioned later are also formed in RAM 2-4) in STEP 4-2 and string numbers 1 through 6 corresponding to the first string through the sixth string are input to the string counter. In STEP 4-3, it is judged whether or not the musical sound is being output based on the string vibration, i.e., whether or not a sound flag of the string corresponding to the value of the string counter has been set. If it is verified that the sound flag has not been set, the process of CPU 2-2 branches to STEP 4-10 and if the sound flag has been set, the process of CPU 2-2 advances to STEP 4-4. In STEP 4-4, it is verified whether or not a predetermined time, i.e., a time interval for executing a frequency control operation has lapsed, or whether or not a time flag of the string corresponding to the value of the string counter has been set. If the result of the above verification is "NO". the process goes to STEP 4-10 and if "YES", then the process advances to step 4-5. The time flag is reset at the time when the sound generation begins or ceases and is also reset in STEP 4-5, while the time flag is set in an interrupt routine of a timer provided in CPU 2-2. That is, the time flag is to be set at predetermined time intervals after the sound generation begins.

In STEP 4-5, the time flag is reset and the input/output control circuit 2-1 inputs to a register Xo the period data of the string of the number corresponding to the value of the string counter to save it therein. The processing on the period data is executed in STEPs 4-6, 4-7, 4-8 and 4-9, thereby a frequency information being output to the musical tone generator control device 1-5.

In STEP 4-6, it is verified whether or not the difference between register Xo and the average of registers $X_{-1}$ and $X_{-2}$, i.e., the average of the period data obtained one time before and that obtained prior to this is smaller than 100 cent. If the result of the above verification is "YES", then register $X_{-1}$ substitutes for register $X_{-2}$and register Xo for register $X_{-1}$, i.e., each period data is substituted by the period data obtained prior to itself in STEP 4-7. If the result, is "NO", register Xo substitutes for registers $X_{-2}$ and $X_{-1}$ in STEP 4-8. In STEP 4-9, the average of registers $X_{-2}$ and $X_{-1}$ is calculated.

That is, in STEP 4-6, if $|Xo-(X_{-1}+X_{-2})/2|<100$ cent, the average of registers Xo and $X_{-1}$ is calculated, while if the above condition is not satisfied, register Xo is treated as the average. Namely, if the pitch of the string vibration varies within a range of ±100 cent, the average of the period data previously obtained and that obtained last is calculated and if the pitch of the string vibration changes over ±100 cent, the frequency of the musical tone is changed depending only on the period data obtained last. In STEP 4-9, a cent data is calculated by using the average of both $X_{-2}$ and $X_{-1}$ and the note-on data obtained in a trigger processing which will be described later. Namely, $(X_{-2}+X_{-1})/2$ is converted into the cent data and then this cent data is transferred to the musical tone generator control device 1-5.

In STEPs 4-10, 4-11 and 4-12, the string counter is incremented by "1" and when the number of the string counter reaches 7 and more, the string counter is set to "1" in STEP 4-12. In STEP 4-13, data processing is performed in an input buffer in order to instruct through the musical tone generator control device 1-5 the musical tone generating device 1-6 to start and/or cease its sound generating operation. Then the process returns to STEP 4-3. When none of the strings vibrates, the processes in STEPs 4-4 through 4-9 are not executed. But only the process of STEP 4-13 is partially executed and the string counter repeats the value from "1" to "6".

A flowchart of an external interrupt processing (an external interrupt) which is to be executed by CPU 2-2 will be described hereinafter with reference to FIG. 5. This flowchart shows a routine which is executed by CPU 2-2 prior to other routines, when CPU 2-2 is externally interrupted while it is processing the main routine. In STEP 5-1, an interrupt flag by an internal timer of CPU 2-2 is masked in order to prohibit the timer from interrupting during the processes in STEPs 5-2 through 5-4 and in STEP 5-5, the above mask is released. In STEP 5-2, data is input from the string sound detecting device 1-3. If the data is a trigger data, a period data of the string corresponding to the string number of the trigger data is fetched from the string pitch extracting device 1-2. In STEP 5-3, the period data is saved in the input buffer. As shown in FIG. 6, the format to save the data has a fixed length of 4 bytes. The lower order 4 bits of the first byte correspond to the string numbers and take values "1"through "6", each of which corresponds to the first string through the sixth string of the electronic string musical instrument. The higher order 4 bits of the first byte represent a command. If all the 4 bits are "0", then these 4 bit data serve as a trigger data. If the fourth bit from MSB is "1" and the left 3 bits are "0", then these 4 bit data serve as an off data. In case of the off data, the second to fourth byte data are idle and can be neglected. The second and third byte data represent the value of the fundamental period and its lower order byte is loaded in the second byte and its upper order byte in the third byte. The fourth byte serves as a level data contained in the trigger data.

Figure 5:
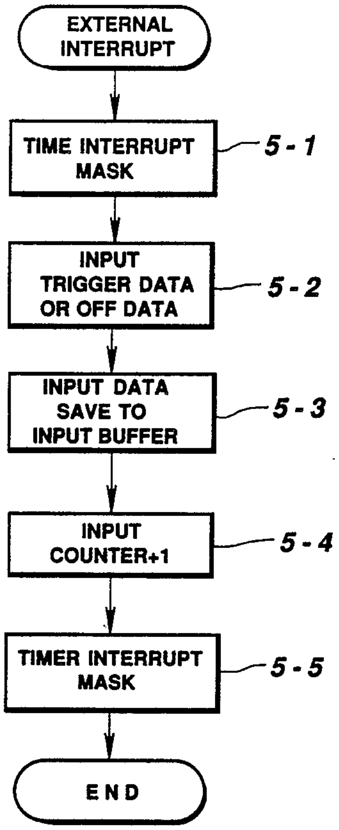
FIG. 5 shows a flowchart of an interrupt routine executed by the CPU when it is externally interrupted.
Figure 6:
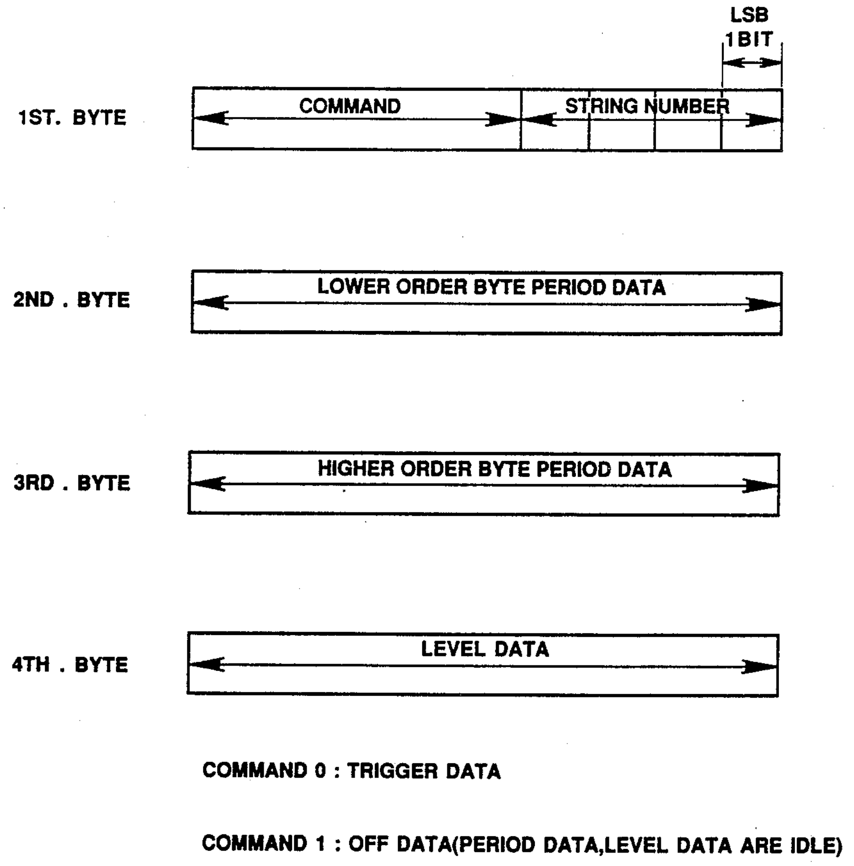
FIG. 6 shows an input data format of data which are provided to the frequency control device.

Now, returning to the description of FIG. 5, in STEP 5-4, the input counter is incremented by "1" and if the byte size of the input buffer reaches ¼ and more, then the input counter returns to "0". In the present embodiment, for example, assuming that the input buffer is 256 bytes, the input counter can take a value from "0" to "63". In this manner, the trigger data and the off data are saved in the input buffer. The saved trigger data is processed in the main routine of CPU 2-2 shown in FIG. 4.

Figure 7:
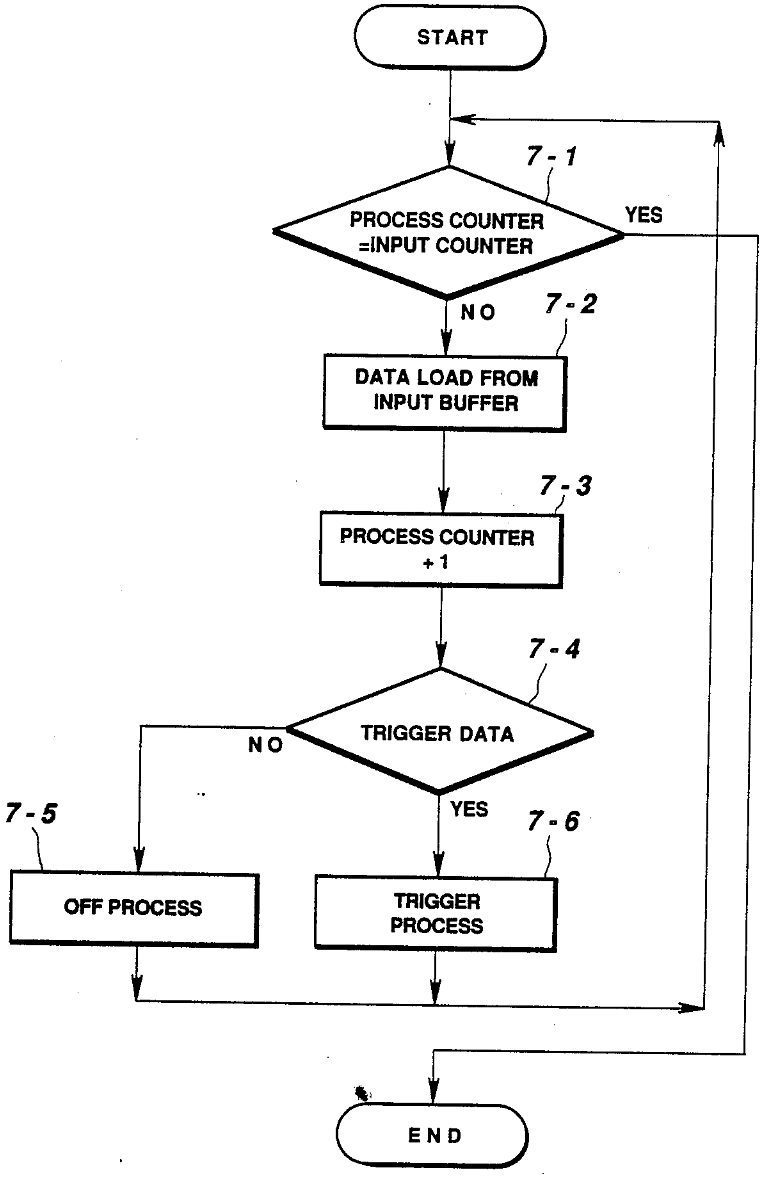
FIG. 7 shows a detailed flowchart of a sub-routine executed for a sound ON/OFF processing.

When the trigger data is saved in the input buffer, the processing of the musical tone generation is performed in STEP 4-13 of FIG. 4. FIG. 7 shows a flowchart of a subroutine of a sound generation ON/OFF processing in STEP 4-13 where the processing is executed in accordance with the external interrupt. In FIG. 7, it is verified in STEP 7-1 whether or not the value of the input counter is equal to that of the process counter. The input counter is incremented by "1" every time when it loads the 4 byte data in the input buffer and the input counter returns to "0", when one fourth of the address size of the input buffer is reached. In the same manner, the process counter is added by "1"every time when the 4 byte data is read out from the input buffer. As both the counters are brought to "0" by the initialization processing, if the values of both counters are equal to each other, this means that the input buffer stores no data and all the interrupt data from the input/output control circuit 2-1 have been processed. Therefore, if the verification in STEP 7-1 results in "YES", the sound generation ON/OFF processing in STEP 4-13 is finalized.

Now, in the present case, as the trigger data is saved in the input buffer, the resultant of the verification processing in STEP 7-1 is "NO" and the 4 byte data whose address corresponding to the value of the input counter is loaded from the input buffer in STEP 7-2. In STEP 7-3, the process counter is incremented by "1" to advance the address by "1" and when the counter value reaches 64 and more in the present embodiment, the address is set to "0". In STEP 7-4, whether or not the data is the trigger data, i.e., the note-on data is verified from the first byte data and if its resultant is "YES", the trigger processing is executed in STEP 7-6. When the resultant of the verification processing in STEP 7-4 is "NO", the data is the off data, and the processing returns to STEP 7-1 after the off operation is executed in STEP 7-5. The above-mentioned processings are repeated until the values of the process counter and the input counter become equal to each other.

Figure 8:
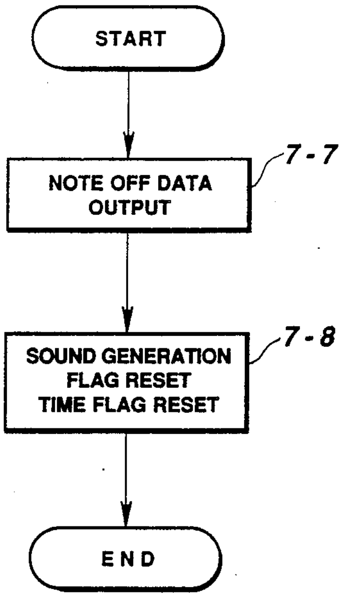
FIG. 8 shows a detailed flowchart executed for the OFF processing of FIG. 7.
Figure 9:
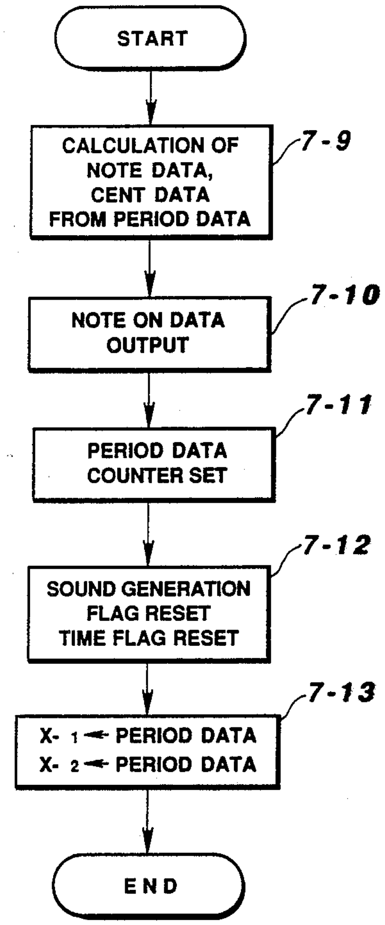
FIG. 9 shows a detailed flowchart executed for a trigger processing of FIG. 7.

FIG. 8 shows the detailed flowchart of the off processing of STEP 7-5. In STEP 7-7, the note-off data is output to the musical tone generator control device 1-5 and in STEP 7-8 the sound generation flag and the time flag are reset thereby terminating the off processing. FIG. 9 shows the detailed flowchart of the trigger processing of STEP 7-6. In STEP 7-9, the note data and the cent data are obtained from the period data of the second byte and the third byte in the data format of FIG. 6. The string number and the level data, as they are, and the obtained note data and the cent data are transferred to the musical tone generator control device 1-5 as the note-on data in STEP 7-10. In STEP 7-11, the above identified counter value is set to the period data counter of the string designated by the string counter and in STEP 7-12, the sound generation flag is set and the time flag is reset. IN STEP 7-13, the period data is written into the registers $X_{-1}$ and $X_{-2}$ of the string corresponding to the string counter, thereby terminating the trigger processing.

Figure 10:
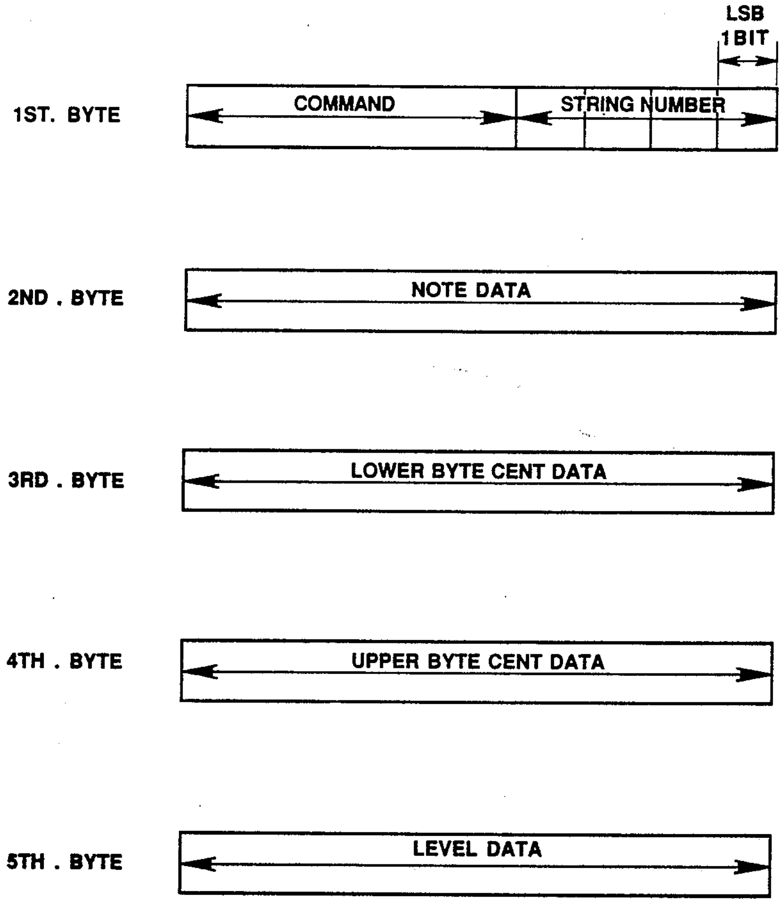
FIG. 10 shows a data format of data supplied by the frequency control device.

FIG. 10 shows an output data format of the data which the input/output control circuit 2-1 transfers to the musical tone generator control device 1-5 through the I/O bus c. AS shown in FIG. 10, one instruction comprises five bytes. The first byte includes the command of 4 bits and the string number of 4 bits. The second byte comprises the note data. The third and fourth bytes comprises a lower byte cent data and an upper byte cent data, respectively. The fifth byte comprises the level data. The command "0"is the trigger data and the command "1" is the off data.

Figure 11:
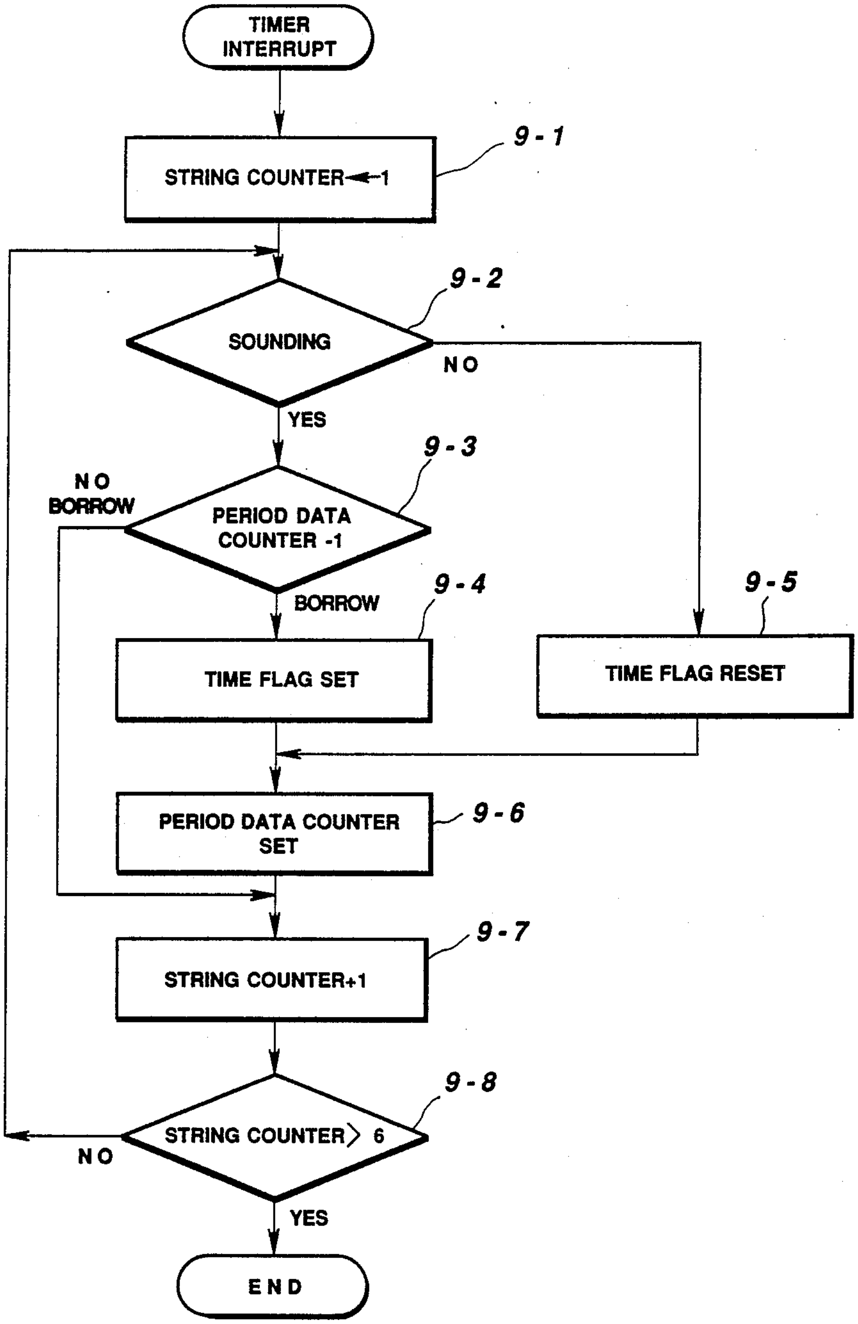
FIG. 11 shows a flowchart of a timer interrupt processing executed by the CPU.

FIG. 11 shows a flowchart of the timer interrupt processing. In this flowchart, in order to set a time flag, i.e., in order to verify that a predetermined time has lapsed in STEP 4-4 of the main routine, the processing is executed independently for each of the strings. In STEP 9-1, the level "1" is written in the string counter. This string counter is used to designate the string number in the same manner as the string counter of FIG. 4, but this string counter is provided independently of that of FIG. 4 and is used only in the time interrupt mode. In STEP 9-2, it is verified whether or not the string is sounding or the sound generation flag corresponding to the value of the string counter is set. If the resultant of the verification is "YES", the value of the corresponding period data counter is decremented by "1" in STEP 9-3, and if a borrow outputs, the time flag is set in STEP 9-4 and the count value of a predetermined time interval is set to the period data counter in STEP 9-6. In the STEP 9-3, it is verified if the numbers of times which the time interrupt are set to the period data counter are input. If no borrow outputs in STEP 9-3, the processing goes to STEP 9-7 and the string counter is incremented by "1". In STEP 9-8, STEPs 9-2 through 9-6 are repeated for the string counter 1 through 6, i.e., the first string to the sixth string. In STEP 9-2, if the resultant of the verification is "NO", the time flag is reset in STEP 9-5 and the count value is written in the similar period data counter corresponding to the string counter in STEP 9-6.

In this way, after the sound generation is started, an instruction is given to change the frequency of the musical tone to be generated in accordance with the period corresponding to the set value of the period data counter.

In the above described embodiment, the pitch of the string vibration is extracted, but the extracted pitch itself is not used to instruct to change the frequency of the musical tone to be generated. In the described embodiment, as long as the difference between the values of the period data obtained last and that obtained previously remains within the range of a given musical interval, the last period data and the previous period data are subjected to a smoothing processing to obtain a desired period data. Accordingly, the fluctuations in the frequency of the musical tone to be sounded are minimized, which fluctuations are caused by the fine frequency fluctuations of the string vibrations, thereby permitting natural sound generation of musical tones. When the player of the instrument intentionally changes the sound frequency, the sound frequency can be changed in accordance with the last altered pitch of the string vibration. In consequence, the frequency control in the electronic string musical instrument can be obtained with an improved faithfulness.

It should be understood that as one embodiment of the present invention has been described above, but that the present invention is not limited to this embodiment. Namely, in the above embodiment, two period data are used to obtain another period data by smoothing them, but the period data to be smoothed are not always limited to two data. Three, four or more period data can be smoothed to obtain a required data. Further, in the electronic string instrument with six strings, the number of the period data to be smoothed for each string and the count number to be set in the period data counter can be selected independently of each other. Furthermore, as for the averages to be obtained by the smoothing calculation, various types of averages can be used, such as the arithmetic mean, the geometrical average or the compositions of the period data obtained last and the previous data which are independently weighted, etc. When, for the period of the fundamental wave previously obtained by the smoothing calculation, it is verified that the period of the fundamental wave lastly or currently extracted remains within the range of a given musical interval, the smoothing calculation can be replaced by the processing for smoothing the fundamental wave period lastly or currently extracted and the period of the fundamental wave previously obtained by the smoothing processing. In this case, the influence of the fluctuations in the pitches can be further minimized.

In the above mentioned embodiment, it is decided whether or not the smoothing processing is performed depending on whether the musical interval varies over the threshold, i.e., ±100 cent. Various values other than an approximate semi tone can be selected as the threshold value. For example, the threshold value can be 50 cent or a half octave and can be experimentally decided.

The present invention can be applied to various types of electronic musical instruments and electronic apparatus other than the electronic string musical instrument. As mentioned above, the present invention can be applied to an apparatus in which the pitches of human voices or instrument sounds are detected and the sounds are artificially generated with frequencies corresponding to the extracted pitches.

What is claimed is:

1. A frequency control device of an electronic string musical instrument in which a vibration waveform is generated on the basis of string vibrations, a fundamental wave period is extracted from the vibration waveform and a sound having a frequency corresponding to the extracted period is generated, comprising:

period extracting means for extracting the fundamental wave period of said vibration waveform;

variation range detecting means for detecting a variation range of the fundamental wave period extracted by said period extracting means; and smoothing means for smoothing a currently extracted fundamental wave period and a previously extracted fundamental wave period to obtain another fundamental wave period, when said variation range detecting means detects that the variation range of the fundamental wave period remains within a predetermined musical interval difference, said smoothing means including means for defining the frequency of an output sound in accordance with said another fundamental wave period.

2. A frequency control device according to claim 1, further comprising:

means for defining the frequency of the output sound in accordance with a fundamental wave period currently extracted by said period extracting means without smoothing the above currently extracted period by said smoothing means, when said variation range detecting means detects that a variation range of said fundamental wave period exceeds a range of the predetermined musical interval difference.

3. A frequency control device according to claim 1, wherein said smoothing means includes means for smoothing the currently extracted fundamental wave period and the previously extracted fundamental wave period, when the variation range of said fundamental wave period remains within a range of ±100 cent.

4. A frequency control device according to claim 1, wherein said smoothing means includes means for calculating an average of the currently extracted fundamental wave period and of at least one previously obtained fundamental wave period.

5. A frequency control device according to claim 3, wherein said smoothing means includes means for calculating an average of the currently extracted fundamental wave period and of at least one previously obtained fundamental wave period.

6. A frequency control device according to claim 1, wherein when the variation range detecting means detects that the currently extracted fundamental wave period Xo, the previously extracted fundamental wave period $X_{-1}$ and the fundamental extracted period $X_{-2}$ extracted prior to the period $X_{-1}$, all of which being extracted by said period extracting means, satisfy the following condition:

$|Xo-(X_{-1}+X_{-2})/2|<100$ cent, then said smoothing means executes a smoothing processing by calculating $(Xo+X_{-1})/2$ to use the quotient as the substitute for the current smoothed fundamental wave period.

7. A frequency control device according to claim 1, wherein when said variation range detecting means detects that the fundamental wave period currently extracted by said period extracting means remains within the range of a predetermined musical interval difference from the fundamental wave period obtained by the smoothing processing, said smoothing mean smooths the currently extracted fundamental wave period and the previously obtained smooth fundamental wave period.

8. A frequency control device according to claim 7, wherein when the variation range detecting means detects that the fundamental wave period currently extracted by said period extracting means remains within the range of ±100 cent with respect to the fundamental wave period previously obtained by the smoothing processing, said smoothing means smooths the currently extracted fundamental wave period.

9. A frequency control device of an electronic apparatus in which a pitch is extracted from an input vibration waveform and a sound is generated with a frequency corresponding to the extracted pitch, comprising:

variation range detecting means for detecting a variation range of the pitch of said input vibration waveform; and control means for obtaining another current pitch by smoothing both a currently extracted pitch of said input vibration waveform and a previously obtained pitch, and for defining the frequency of a sound to be output in accordance with the thus obtained another current pitch, when said variation range detecting means detects that the variation range of the pitch of the input vibration waveform remains within a range of a predetermined musical interval difference; and said control means further including means for defining the frequency of the sound to be output in accordance with the currently extracted pitch of the input vibration waveform which serves as the current pitch, when the variation range detecting means detects that the variation range of the pitch of the input vibration waveform exceeds the range of the predetermined musical interval difference.

10. A frequency control device according to claim 9, wherein said control means includes means for obtaining said another current pitch by smoothing currently extracted pitch and previously obtained pitch when said variation range detecting means detects that the variation range of the pitch of said input vibration waveform remains within the range of ±100 cent and defines the frequency of the sound to be output in accordance with said obtained another current pitch, and said control means includes means for defining the frequency of the sound to be output in accordance with the currently extracted pitch which serves as said another current pitch, when said variation range detecting means detects that the variation range of the pitch of the input vibration waveform exceeds the range of ±100 cent.

11. An electronic string musical instrument having plurality of strings, comprising:

string vibration start detecting means for detecting a start of a string vibration;

pitch extracting means for extracting a pitch from the string vibration;

musical tone generating means for generating a musical tone of frequency in accordance with the pitch extracted by said pitch extracting means, when the start of the string vibration is detected by said string vibration start detecting means; and sound frequency control means for controlling said musical tone generating means so as to vary with a time lapse the frequency of the output musical tone in accordance with the pitch extracted by said pitch extracting means, said sound frequency control means including average operation means for performing an averaging operation for defining the frequency of the output musical tone, as long as a variation range of the pitch of the string vibration extracted by said pitch extracting means remains within a semi tone.

12. An instrument having at least one string, in which a sound is electronically generated in response to a vibration of said string, comprising:

pitch extracting means for extracting the pitch from said string vibration;

instructing means for instructing generation of a musical tone of a frequency in accordance with the string vibration pitch extracted by said pitch extracting means; and sound frequency control means for varying with a time lapse the frequency of the musical tone to be generated responsive to an instruction from said instructing means in accordance with the string vibration pitch extracted by said pitch extracting means, said sound frequency control means including smoothing operation means for defining a frequency of an output musical tone after performing a smoothing operation, as long as a variation range of the string vibration pitch extracted by said pitch extracting means remains within a predetermined range, and also for defining the frequency of the output musical tone in accordance with the extracted pitch without performing a smoothing operation, when said variation range of the string vibration pitch exceeds the predetermined range.

13. An electronic string musical instrument having a plurality of strings, comprising:

string vibration start detecting mean for detecting a start of a string vibration;

pitch extracting means for extracting a pitch from the string vibration;

instructing means for instructing generation of a musical tone of a frequency in accordance with the string vibration pitch extracted by said pitch extracting means when the start of the string vibration is detected by said string vibration start detecting means;

timer means for counting predetermined time intervals;

alteration control means for controlling, every time when said timer means counts the predetermined time intervals, the frequency of a musical tone generated responsive to an instruction from said instructing means, in accordance with the string vibration pitch extracted by said pitch extracting means, said alternation control means including means for controlling the frequency of the musical tone in accordance with the pitch obtained by smoothing both the string vibration pitch currently extracted by said pitch extracting means and a previously extracted string vibration pitch as long as the variation range of said currently extracted string vibration pitch remains within a predetermined range, and for controlling the frequency of the musical tone in accordance with the currently extracted string vibration pitch without smoothing said string vibration pitches when the variation range of said currently extracted string vibration exceeds the predetermined range.

14. An electronic string musical instrument according to claim 13, wherein said alteration control means includes means for controlling alteration of the frequency of the musical tone in accordance with another pitch obtained by calculating an average of a currently extracted string vibration pitch and at least one string vibration pitch previously extracted, as long as the variation range of the currently extracted string vibration pitch remains within a range of an approximate semi tone.

15. An electronic string musical instrument according to claim 13, wherein said timer means includes means for performing a time interval counting operation at time intervals different from string to string, thereby causing said alteration control means to alter the frequency of the musical tones at rates which are different from string to string.

* * * * *